United States Patent [19]

Sugawa et al.

[11] Patent Number: 5,414,275
[45] Date of Patent: May 9, 1995

[54] PHOTOELECTRIC CONVERTING DEVICE AND IMAGE PROCESSING APPARATUS UTILIZING THE SAME

[75] Inventors: Shigetoshi Sugawa; Ihachiro Gofuku, both of Atsugi, Japan

[73] Assignee: Canon Kabushiki Kaisha, Tokyo, Japan

[21] Appl. No.: 161,441

[22] Filed: Dec. 6, 1993

Related U.S. Application Data

[63] Continuation of Ser. No. 44,090, Apr. 6, 1993, abandoned, which is a continuation of Ser. No. 815,024, Dec. 31, 1991, abandoned.

[30] Foreign Application Priority Data

Jan. 11, 1991 [JP] Japan ................. 3-012595

[51] Int. Cl.⁶ .......................................... H01L 27/14
[52] U.S. Cl. ......................................... 257/53; 257/56; 257/55; 257/59; 257/458; 136/258; 136/261
[58] Field of Search ............ 357/2, 30 K, 30 P, 30 H, 357/30 I, 32, 24 LR, 60, 59 C, 59 D; 136/258, 261; 257/443, 59, 448, 458, 53, 54, 55, 56

[56] References Cited

U.S. PATENT DOCUMENTS

| 4,085,711 | 2/1992 | Iwamoto et al. | 357/30 J X |
| 4,600,801 | 7/1986 | Guha et al. | 357/30 K X |
| 4,680,607 | 7/1987 | Fukatsu et al. | 357/30 K |
| 4,695,859 | 9/1987 | Guha et al. | 357/19 |
| 4,737,196 | 4/1988 | Yukimoto | 357/30 J X |
| 4,857,115 | 8/1989 | Iwamoto et al. | 357/30 K |
| 4,962,412 | 10/1990 | Shinohara et al. | 357/30 |
| 5,085,711 | 2/1992 | Iwamoto el al. | 357/30 J X |

FOREIGN PATENT DOCUMENTS 390522 10/1990 European Pat. Off. .
2192487 1/1988 United Kingdom .

OTHER PUBLICATIONS

Patent Abstracts of Japan, No. 9, No. 263<E-351>(1986), Oct. 19, 1985.
Patent Abstracts of Japan, vol. 11, No. 36 [E-477](2483), Feb. 3, 1987.

*Primary Examiner*—William Mintel
*Attorney, Agent, or Firm*—Fitzpatrick, Cella, Harper & Scinto

[57] ABSTRACT

A photoelectric converting device with PIN structure includes an amorphous I-type semiconductor layer and charge injection blocking layers positioned to sandwich the I-type layer. At least one of the charge injection blocking layers comprises an amorphous P- or N-semiconductor layer in contact with the I-type layer and an amorphous P- or N-semiconductor layer containing microcrystalline structure.

11 Claims, 3 Drawing Sheets

PHOTOELECTRIC CONVERTING DEVICE AND IMAGE PROCESSING APPARATUS UTILIZING THE SAME

This application is a continuation of application Ser. No. 08/044,090, filed Apr. 6, 1993, now abandoned, which, in turn, is a continuation of application Ser. No. 07/815,024, filed Dec. 31, 1991, now abandoned.

BACKGROUND OF THE INVENTION

1. Field of the Invention

The present invention relates to a photoelectric converting device and an image processing apparatus utilizing the same, and more particularly to a photoelectric converting device of high sensitivity and high response capable of high-speed image reading, and an image processing apparatus utilizing said photoelectric converting device.

2. Related Background Art

In image information systems, optical communication and other industrial and consumer fields utilizing light as the medium of information signals, the semiconductive photosensor for converting optical signals into electrical signals is one of the most important and most basic components, and is already commercialized in various structures.

Such a photosensor is generally required to have a high signal-to-noise (S/N) ratio, a high sensitivity for image reading and a high response speed, during the photoelectric conversion. Further, for applications as the input device for a high-speed facsimile, an image scanner, a copying machine or other image processing equipment, said photosensor is desired in the contact configuration for facilitating compactization of such equipment, and the formation of a large-area element array is required. On the other hand, in the area sensors employed, for example, in the industrial or consumer video cameras, the pixel area has to be formed as large as possible, as the output of such photosensor generally becomes smaller as the density of pixels becomes higher. Based on these situations, technical development for the photoelectric converting device is being directed to signal processing circuits and the photosensor in a superposed structure, thereby effectively utilizing the surface area.

For meeting these requirements for the photoelectric converting device, a photodiode having a PIN structure, based on amorphous silicon is considered useful.

However, in the simplest structure of such a PIN photodiode, all the layers are formed with amorphous silicon. It is difficult to achieve, at the practical level, (1) a reduction of dark current by blocking minority carriers, which is an important function of the P- or N-doped layer, and (2) a low afterimage characteristic, at the same time.

Figure 1:
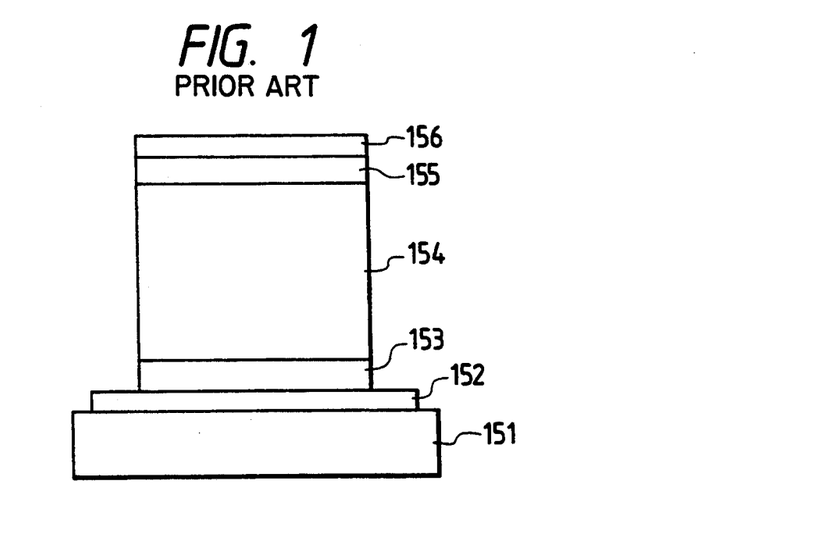
FIG. 1 is a schematic cross-sectional view of a conventional photoelectric converting device.

This phenomenon will be explained in more detail with reference to FIG. 1, which is a schematic cross-sectional view of a photoelectric converting device. In FIG. 1 there are shown a glass substrate 151; an electrode 152 for example of chromium; an amorphous N-silicon carbide layer 153; an amorphous I-silicon layer 154; an amorphous P-silicon carbide layer 155; and a transparent electrode 156. In the device illustrated in FIG. 1, the minority carriers injected from the electrodes can be effectively blocked, and the dark current can thus be reduced, by forming the P- and N-semiconductor layers with materials of wider energy gap than that of the material constituting the I-semiconductor layer. However, an energy band discontinuity and an interface trap level resulting from a junction of different materials are formed at the interface between the P-and I-semiconductor layers, and the resulting carrier trapping at said interface creates the afterimage phenomenon.

Therefore, said interface is preferably free from the energy band discontinuity and the trap level for reducing the afterimage phenomenon. For this reason, there have been attempts to form the P-and N-semiconductor layers with amorphous silicon in the same manner as the I-semiconductor layer. Such configuration eliminates the energy band discontinuity and the trap level at said interface, but results in an increased injected current, since the doping efficiency cannot be effectively increased, thus leading to an increase in the dark current.

SUMMARY OF THE INVENTION

In consideration of the foregoing, the object of the present invention is to provide a photoelectric converting device capable of avoiding the formation of energy band discontinuity and trap level at the interface with the I-semiconductor layer, and also improving the doping efficiency, thereby effectively blocking the current injected from the electrodes.

DESCRIPTION OF THE PREFERRED EMBODIMENTS

The above-mentioned object can be attained, according to the present invention, by a photoelectric converting device with PIN structure including an amorphous I-semiconductor layer and charge injection blocking layers so positioned as to sandwich said I-semiconductor layer, wherein each of said charge injection blocking layers comprises an amorphous P- or N-semiconductor layer positioned in contact with said I-semiconductor layer and a P- or N-semiconductor layer including microcrystalline structure.

The I-semiconductor layer means a layer in which the impurity for controlling the conductive type is not intentionally added or the conductive type is maintained neutral by mutual compensation of the conductivity-controlling impurities of opposed conductive types.

The presence of the amorphous P- and N-semiconductor layers including microcrystalline structure so as to sandwich the amorphous I-semiconductor layer permits elevation of the doping efficiency, thereby improving the charge injection blocking efficiency, as compared to employing amorphous P- or N-semiconductor layers only.

Also the amorphous P- or N-semiconductor layer including microcrystalline structure has a lower trap level, thus showing less tendency of carrier trapping in the vicinity of the I-semiconductor layer, in comparison with the amorphous P- or N-semiconductor layer. Therefore the removal of trapped carriers is made easier at the regenerating operation, and it is furthermore rendered possible to reduce the afterimage phenomenon and to improve the response.

The amorphous semiconductor layer is preferably composed of amorphous silicon containing hydrogen, in consideration of the desirability of large-area film formation at a low temperature, but it may also be composed of amorphous semiconductors principally composed of germanium or containing silicon and germanium.

The amorphous semiconductor layer may further contain other elements such as carbon, oxygen and/or nitrogen according to necessity.

The impurity added to the charge injection blocking layer is an element of the Group III of the Periodic Table for obtaining a P-type layer, or an element of the Group V of the Periodic Table for obtaining an N-type layer. Examples of the element of the Group III include B (boron), Al (aluminum), Ga (gallium), In (indium) and Tl (thallium), among which particularly preferred are B and Ga. Examples of the element of the group V include P (phosphorous), As (arsenic), Sb (antimony) and Bi (bismuth), among which particularly preferred are P and Sb.

The concentration of the added impurity is preferably at least equal to $10^{10}$ cm$^{-3}$, and is selected within a range of $10^{19}$ to $10^{20}$ cm$^{-3}$ according to necessity.

The "microcrystalline" structure used in the present invention is defined as a structure in which small crystal particles, with an average particle size from several tens to several hundred Angstroms are mixed in an amorphous substance. The size of said crystal particles can be determined, for example, by X-ray diffractometry or Raman spectroscopy.

Since the charge-injection blocking semiconductor layers (impurity-containing layers) are based on an element which is the same as the principal component of the I-semiconductor layer and are positioned in contact therewith, the deterioration in afterimage phenomenon and in photosensitivity can be prevented by suitable selection of the thickness of said impurity-containing layers in such a manner that the depletion layer, entering said impurity-containing layer by an electric field applied to the I-semiconductor layer, does not reach the impurity-containing layer which contains an element for expanding the forbidden band width (such as oxygen or carbon).

Said layer thickness $d_{uc}$ is preferably so selected as to satisfy the following relation:

$$d_{uc} = \{\epsilon \cdot (V_R + \phi_{BI})\}/q \cdot N \cdot d_I$$

wherein:
$d_I$: thickness of I-layer
N: concentration of impurity (activated)
$\epsilon$: dielectric constant of impurity-containing layer
$V_R$: applied voltage
$\phi_{BI}$: built-in potential of PIN junction
q: unit charge and said thickness is to be determined in consideration of the maximum drive voltage of the sensor.

As an example, for conditions of $d_I = 1$ μm, $N = 10^{18}$ cm$^{-3}$ and $V_R = 5$ V, the required minimum thickness is about 40 Å.

The transparent electrode can be composed for example of ITO, $SnO_2$ or $ZnO_2$, and the lower electrode can be composed of an ordinary metal electrode for example of Cr, Al or Ti, or of an N- or P-polysilicon film containing an impurity at a high concentration. Also in case the substrate is a semiconductor substrate, the lower electrode may be formed by forming a high-concentration impurity-containing layer in said substrate and opening a contact hole in an insulation film formed thereon.

In the following the present invention will be clarified further by an embodiment shown in the attached drawings.

Figure 2:
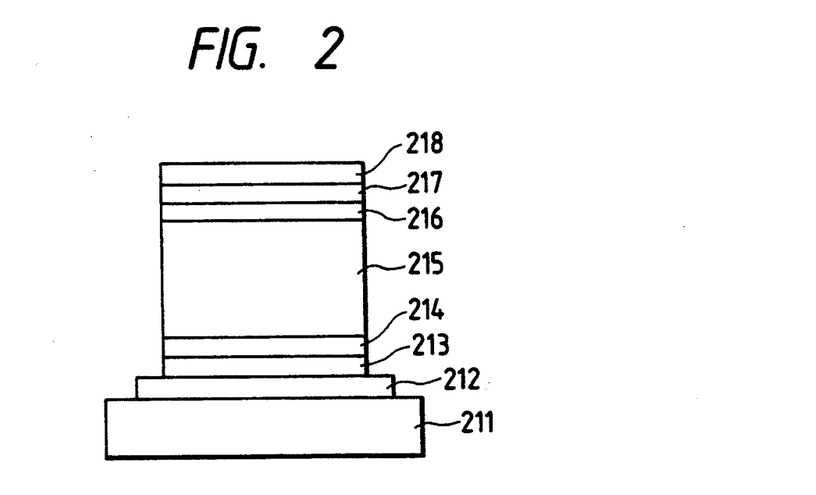
FIG. 2 is a schematic cross-sectional view of an embodiment of the photoelectric converting device of the present invention.

FIG. 2 shows an example of the photoelectric converting device of the present invention, which is prepared in the following manner. At first, on a substrate 211 composed of Corning #7059 glass, a Cr film of a thickness of 2000 Å is formed by sputtering, and is etched by an ordinary photolithographic process to form the lower electrode 212 of the photodiode. Then the substrate is set at a temperature of 300° C. in a capacity-coupled CVD apparatus, then $SiH_4$, $PH_3$ diluted to a concentration of 10% with $H_2$, and $H_2$ are introduced into the film forming chamber with respective flow rates of 6, 24 and 450 SCCM, and discharge is conducted for 15 minutes with an RF energy of 0.5 W/cm$^2$ between the electrodes and with a gas pressure of 2.0 Torr in said film forming chamber, thereby depositing an amorphous N-silicon layer 213 containing microcrystals, with a thickness of ca. 250 Å. Then the substrate is set at a temperature of 300° C. in the same capacity-coupled CVD apparatus, then $SiH_4$, $PH_3$ diluted to a concentration of 10% with $H_2$, and $H_2$ are introduced into the film forming chamber with respective flow rates of 12, 6 and 300 SCCM, and discharge is conducted for 1 minute with an RF energy of 0.03 W/cm$^2$ between the electrodes and with a gas pressure of 1.2 Torr in said film forming chamber, thereby depositing an amorphous N-silicon layer 214 with a thickness of ca. 100 Å and thus completing the charge blocking N-layer.

Subsequently, the substrate is set at 300° C. in the capacity-coupled CVD apparatus, $SiH_4$ and $H_2$ are introduced with respective flow rates of 30 and 30 SCCM into the film forming chamber, and discharge is conducted for 75 minutes with an RF power of 0.2 W/cm$^2$ between the electrodes and with a gas pressure of 0.3 Torr in said film forming chamber, thereby depositing an amorphous I-silicon layer 215 of a thickness of ca. 8000 Å, constituting the light absorbing layer.

Furthermore, the substrate is set at 300° C. in the same capacity-coupled CVD apparatus, then $SiH_4$, $B_2H_6$ diluted to 10% with $H_2$, and $H_2$ are introduced with respective flow rates of 12, 3 and 300 SCCM into the film forming chamber, and discharge is conducted for 1 minute with an RF power of 0.03 W/cm$^2$ and with a gas pressure of 1.2 Torr in said film forming chamber, thereby depositing an amorphous P-silicon layer 216 of a thickness of ca. 100 Å. Subsequently, the substrate is set at 300° C, in the capacity-coupled CVD apparatus, $SiH_4$, $B_2H_6$ diluted to 10% with $H_2$, and $H_2$ are introduced with respective flow rates of 6, 12 and 450 SCCM into the film forming chamber, and discharge is conducted for 15 minutes with an RF power of 0.5 W/cm$^2$ between the electrodes and with a gas pressure of 2.0 Torr in said film forming chamber, thereby depositing an amorphous P-semiconductor layer 217, containing microcrystals, with a thickness of ca. 250 Å and thus completing the charge blocking P-layer.

Thereafter, an ITO (indium tin oxide) film of a thickness of 700 Å is deposited by sputtering and is etched into a desired form by an ordinary photolithographic process to obtain an upper transparent electrode 218.

A photodiode, prepared according to the above-explained process, showed a low dark current, in the order of $3 \times 10^{-11}$ A/cm$^2$ under a reverse bias voltage of 5 V, and had the afterimage phenomenon, measured by the resetting time in microseconds in the accumulating mode, as low as ca. 0.5% in the first field.

In the following there will be explained an embodiment in which the above-explained photoelectric converting device is superposed on a scanning and readout circuit disclosed by the present inventors in the U.S. Pat. No. 4,962,412.

Figure 3A:
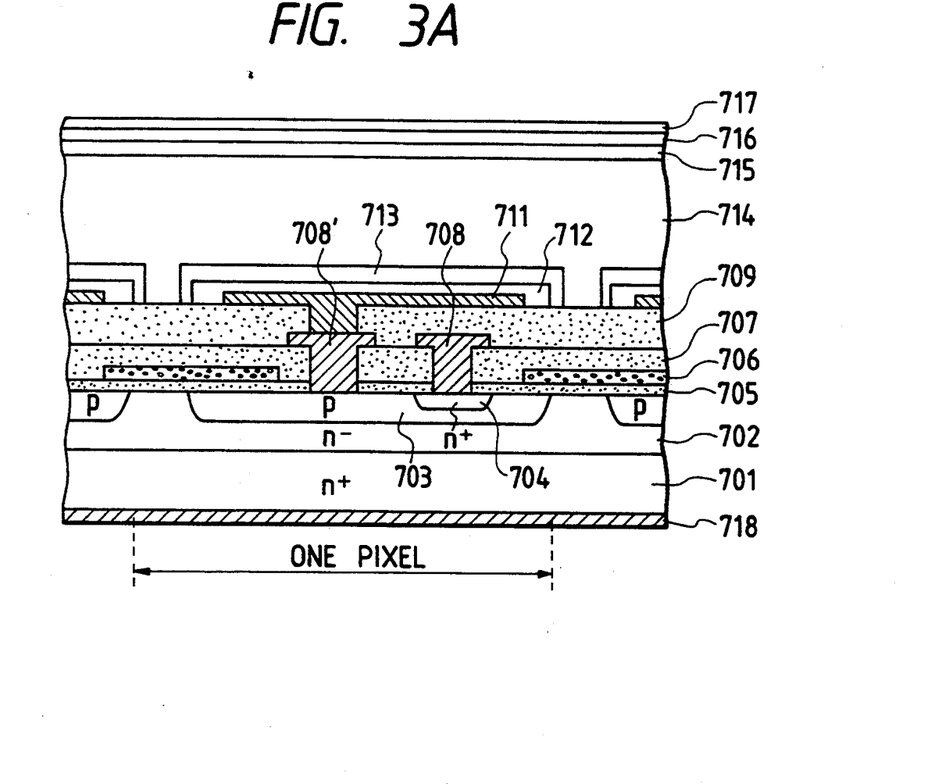
FIG. 3A is a schematic cross-sectional view of the structure around the light-receiving area of another embodiment of thee photoelectric converting device of the present invention.
Figure 3B:
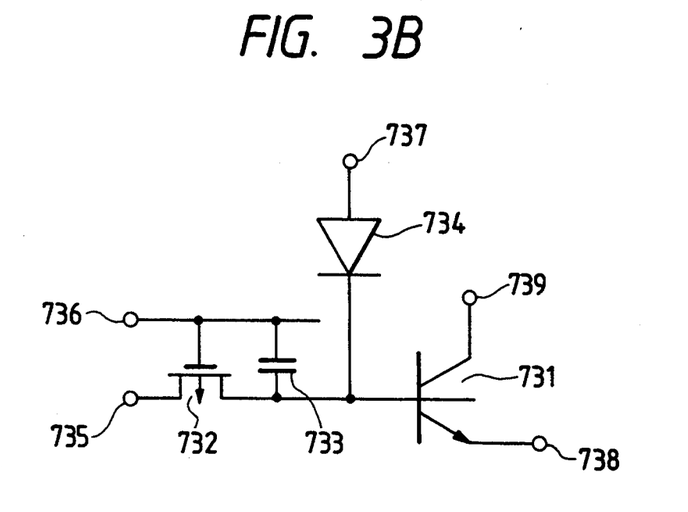
FIG. 3B is an equivalent circuit diagram of a pixel.
Figure 3C:
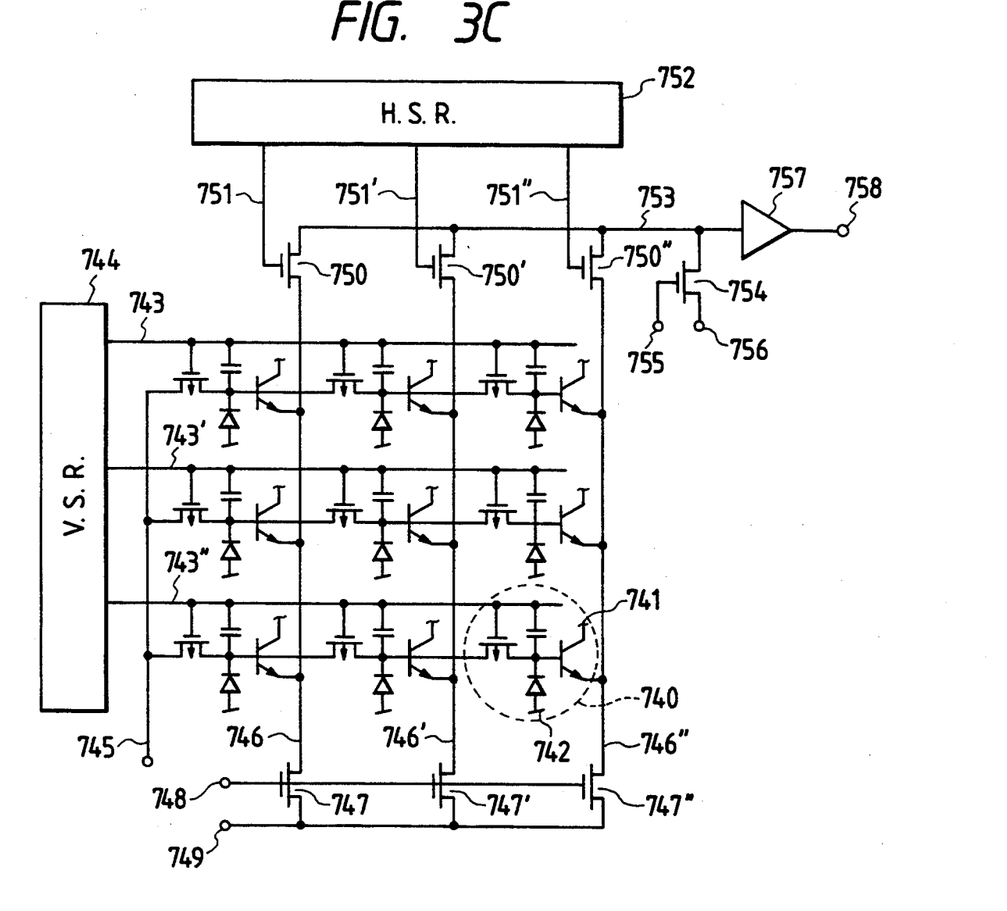
FIG. 3C is an equivalent circuit diagram of the entire photoelectric converting device.

FIG. 3A is a partial cross-sectional view of said embodiment, FIG. 3B is an equivalent circuit diagram of a pixel thereof, and FIG. 3C is an equivalent circuit diagram in a two-dimensional arrangement of said pixel.

As shown in FIG. 3A, in the photoelectric converting device of the present embodiment, an n-silicon substrate 701 is provided thereon with an epitaxially grown n$^-$-layer 702, constituting a collector area, in which formed are a p-base area 703 and an n+-emitter area 704 to constitute a bipolar transistor.

The p-base area 703 is isolated from the adjacent pixel, and, between the horizontally adjacent p-base areas there is provided a gate electrode 706 over an oxide film 705, whereby a p-channel MOS transistor is formed with said p-base areas serving as source and drain electrodes. The gate electrode 706 also serves as a capacitor for controlling the potential of the p-base area 703.

After the formation of an insulation layer 707, an emitter electrode 708 and a base electrode 708' are formed.

Subsequently, an insulation layer is formed, and a conductive layer is formed and isolated into each pixel to form an electrode 711, which is electrically connected with the electrode 708'. Then an amorphous N-silicon layer 712 containing microcrystals is formed and separated into respective pixels, and an amorphous N-silicon layer 713 is formed and separated into respectively pixels to constitute the charge injection blocking N-layer. Subsequently, an amorphous I-silicon layer 714 is formed to constitute the light absorbing layer. Then an amorphous P-silicon layer 715 and an amorphous P-silicon layer 716 containing microcrystals are formed to constitute the charge injection blocking P-layer. Finally a transparent electrode 717 is formed. On the rear face of the substrate 701, a collector electrode 718 is formed in ohmic contact.

Therefore, in the equivalent circuit, as shown in FIG. 3B, to the base of a bipolar transistor 731 constructed in crystalline silicon, there are connected a p-channel MOS transistor 732, a capacitor 733 and a photoelectric converting device 734 same as in the above-explained embodiment. Also, there are provided a terminal 735 for providing the base with a potential, a terminal 736 for driving the p-channel MOS transistor 732 and the capacitor 733, a sensor electrode 737, an emitter electrode 738, and a collector electrode 739.

FIG. 3C is a circuit diagram of a two-dimensional device in which the unit cell 740 shown in FIGS. 3A and 3B is arranged in a 3×3 matrix.

As shown in FIG. 3C, each of the unit pixel cells 740 is provided with the collector electrode 741 and the sensor electrode 742. The gate electrodes of the PMOS transistors of the unit pixel cells are connected, commonly for respective rows, to drive lines 743, 743', 743" which are connected to a vertical shift register (VSR) 744. Also, the emitter electrodes are connected, commonly for respective columns, to signal readout vertical lines 746, 746', 746", which are respectively connected to switches 747, 747', 747" for resetting the charges in the vertical lines and readout switches 750, 750', 750". The gate electrodes of said reset switches 747, 747', 747" are commonly connected to the terminal 748 for applying a vertical line resetting pulse, and the source electrodes are commonly connected to a terminal 749 for applying a vertical line resetting voltage. The gate electrodes of the readout switches 750, 750', 750" are connected, respectively through lines 751, 751', 751", to a horizontal shift register 752, and the drain electrodes thereof are connected to an output amplifier 757 through a horizontal readout line 753, which is also connected to a switch 754 for resetting the charge in said horizontal readout line.

Said reset switch 754 is connected to a terminal 755 for applying a horizontal line resetting pulse and a terminal 756 for applying a horizontal line resetting voltage.

The output of the amplifier 757 is released from a terminal 758.

In the following there will be briefly explained the function of the present embodiment, with reference to FIGS. 3A to 3C.

The light entering the light-absorbing layer 714, shown in FIG. 3A, is absorbed therein and generates carriers, which are accumulated in the base area 703.

When a drive pulse released from the vertical shift register, shown in FIG. 3C, appears on the drive line 743, the base potential is elevated through the capacitor, whereby the signal charges, corresponding to the amount of incident light, are obtained from the pixels of the first row to the vertical lines 746, 746', 746".

Then the horizontal shift register 752 releases scanning pulses in succession to the lines 751, 751', 751" to effect on-off control of the switches 750, 750', 750" in succession, whereby the signals are supplied to the output terminal 758 through the amplifier 757. The reset switch 754 is turned on, between the successive on-states of the switches 750, 750', 750", thereby eliminating the remaining charge in the horizontal line 753.

Then the vertical line resetting switches 747, 747', 747" are turned on to eliminate the remaining charges in the vertical lines 746, 746', 746". Then the vertical shift register 744 applies a negative pulse to the drive line 743 to turn on the PMOS transistors of the pixels of the first row, thereby eliminating the remaining charges in the bases of said pixels and thus initializing said pixels.

Then a drive pulse from the vertical shift register 744 appears on the drive line 743', whereby signal charges of the pixels of the second row are taken out in a similar manner.

Subsequently the signal charges of the pixels of the third row are taken out in a similar manner. The present device functions by the repetion of the above-explained sequences.

Figure 4:
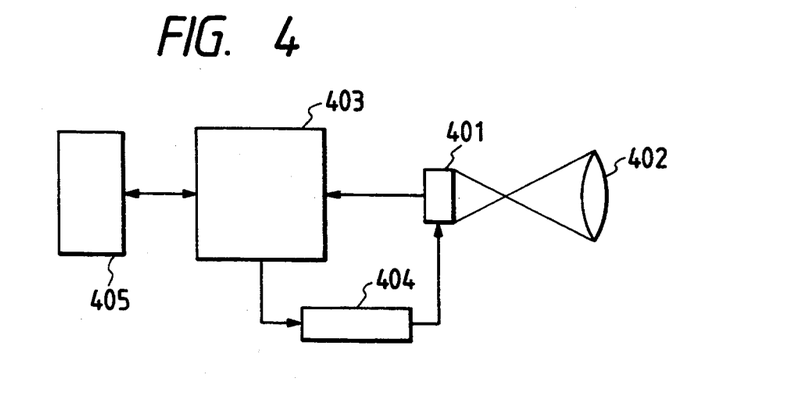
FIG. 4 is a block diagram of an image processing apparatus employing the photoelectric converting device of the present invention.

FIG. 4 shows an example of the image processing apparatus employing the photoelectric converting device shown in FIGS. 3A to 3C.

A photoelectric converting device 401, having photoelectric converting elements arranged in a two-dimensional matrix, receives image information focused by an optical system 402. A control circuit 403 generates a signal for driving a driver circuit 404, which in turn drives said photoelectric converting device 401. The signal, released from said device 401 and bearing image information, is suitably processed in the control circuit 403, and is recorded, in the present case, in a memory 405, consisting for example of a magnetic tape, a magnetic disk, an optical disk or a semiconductor memory.

In such image processing apparatus, the photoelectric converting device of the present invention, capable of high-speed image reading and with reduced afterimage phenomenon, enables clear image recording with high image quality.

In the present embodiment the image information is recorded in a memory, but it is also possible to supply said image information to an image display device such as a cathode ray tube or a liquid crystal display device, or to send it to light emitting means such as a semiconductor laser, thereby obtaining a recorded image through an electrophotographic process.

The present invention is furthermore applicable to an image processing apparatus for transmitting the read image information to another apparatus for example through a communication channel, such as a facsimile apparatus.

In the above-explained embodiment there is employed a circuit invented by the present inventors, but the device of the present invention is likewise applicable to the circuits of the known photoelectric converting devices.

Furthermore, the photoelectric converting device of the present invention is subject to various modifications within the scope and spirit of the appended claims.

As explained in the foregoing, the present invention allows improvement of the dark current characteristic and the afterimage characteristic of a photodiode or the like utilizing amorphous semiconductor.

Also the present invention provides a photoelectric converting device, which is featured by little afterimage phenomenon through the absence of energy band discontinuity and trap level at the interface with the I-semiconductor layer and also by an improved doping efficiency enabling effective blocking of the injection current from the electrodes, and an image processing apparatus utilizing such a device.

What is claimed is:

1. A photoelectric converting device with a PIN structure comprising: an amorphous I-type semiconductor layer; a pair of charge injection blocking layers sandwiching said amorphous I-type semiconductor layer, wherein one of said charge injection blocking layers comprises an amorphous P-type semiconductor layer and the other comprises an amorphous N-type semiconductor layer; and at least one of an amorphous P-type semiconductor layer containing microcrystalline structure on said amorphous P-type semiconductor layer and an amorphous N-type semiconductor layer containing microcrystalline structure on said amorphous N-type semiconductor layer, whereby said photoelectric converting device is reversely biased in operation.

2. A photoelectric converting device according to claim 1, wherein each of said amorphous semiconductor layers is composed of amorphous silicon containing hydrogen.

3. A photoelectric converting device comprising a PIN structure with a semiconductor portion, said semiconductor portion comprising an amorphous I-type semiconductor layer, an amorphous P-type semiconductor layer and an amorphous N-type semiconductor layer sandwiching said I-type layer, at least one of an amorphous P-type semiconductor layer containing microcrystalline structure on said amorphous P-type semiconductor layer and an amorphous N-type semiconductor layer containing microcrystalline structure on said amorphous N-type semiconductor layer and a pair of electrodes sandwiching said semiconductor portion of said PIN structure, whereby said photoelectric converting device is reversely biased in operation.

4. A photoelectric converting device according to claim 3, wherein said amorphous semiconductor contains at least one of silicon and germanium.

5. A photoelectric converting device according to claim 3, wherein said amorphous semiconductor contains at least an element selected from the group consisting of carbon, oxygen and nitrogen.

6. A photoelectric converting device with a PIN structure comprising: an amorphous I-type semiconductor layer; a pair of charge injection blocking layers sandwiching said amorphous I-type semiconductor layer, wherein one of said charge injection blocking layers comprises an amorphous P-type semiconductor layer and the other comprises an amorphous N-type semiconductor layer; and at least one of an amorphous P-type semiconductor layer containing microcrystalline structure on said amorphous P-type semiconductor layer and an amorphous N-type semiconductor layer containing microcrystalline structure on said amorphous N-type semiconductor layer; said PIN structure is formed on a bipolar transistor, whereby said photoelectric converting device is reversely biased in operation.

7. An image processing apparatus comprising:
a photoelectric converting device with a PIN structure reversely biased in usage comprising: an amorphous I-type semiconductor layer; a pair of charge injection blocking layers sandwiching said amorphous I-type semiconductor layer, wherein one of said charge injection blocking layers comprises an amorphous P-type semiconductor layer and the other comprises an amorphous N-type semiconductor layer; and at least one of an amorphous P-type semiconductor layer containing microcrystalline structure on said amorphous P-type semiconductor layer and an amorphous N-type semiconductor layer containing microcrystalline structure on said amorphous N-type semiconductor layer;
an optical system for entering image information into said photoelectric converting device;
a driver comprising a reverse biasing circuit for driving said photoelectric converting device; and
a control circuit for generating a signal for driving said driver and processing an output signal from said photoelectric converting device; whereby said photoelectric converting device is reversely biased in operation.

8. A photoelectric converting device according to claim 1, wherein at least one of said amorphous P-type and N-type semiconductor layer has a thickness in accordance with the following equation:

$$d_{uc} = \{\epsilon \cdot (V_R + \phi_{BI})\}/q \cdot N \cdot d_I$$

wherein $d_{uc}$ is a thickness of at least one of said amorphous P-type and N-type semiconductor layer, $d_I$ is a thickness of said I-type semiconductor layer, N is an impurity concentration in at least one of said amorphous P-type and N-type semiconductor layer, $\epsilon$ is a dielectric constant in at least one of said amorphous P-type and N-type semiconductor layer, $V_R$ is a reverse bias voltage, $\phi_{BI}$ is a built-in potential of a PIN junction, and q is a unit charge.

9. A photoelectric converting device according to claim 3, wherein at least one of said amorphous P-type and N-type semiconductor layer has a thickness in accordance with the following equation:

$$d_{uc} = \{\epsilon \cdot (V_R + \phi_{BI})\}/q \cdot N \cdot d_I$$

wherein $d_{uc}$ is a thickness of at least one of said amorphous P-type and N-type semiconductor layer, $d_I$ is a thickness of said I-type semiconductor layer, N is an impurity concentration in at least one of said amorphous P-type and N-type semiconductor layer, $\epsilon$ is a dielectric constant in at least one of said amorphous P-type and N-type semiconductor layer, $V_R$ is a reverse bias voltage, $\phi_{BI}$ is a built-in potential of a PIN junction, and q is a unit charge.

10. A photoelectric converting device according to claim 6, wherein at least one of said amorphous P-type and N-type semiconductor layer has a thickness in accordance with the following equation:

$$d_{uc} = \{\epsilon \cdot (V_R + \phi_{BI})\}/q \cdot N \cdot d_I$$

wherein $d_{uc}$ is a thickness of at least one of said amorphous P-type and N-type semiconductor layer, $d_I$ is a thickness of said I-type semiconductor layer, N is an impurity concentration in at least one of said amorphous P-type and N-type semiconductor layer, $\epsilon$ is a dielectric constant in at least one of said amorphous P-type and N-type semiconductor layer, $V_R$ is a reverse bias voltage, $\phi_{BI}$ is a built-in potential of a PIN junction, and q is a unit charge.

11. An image processing apparatus according to claim 7, wherein at least one of said amorphous P-type and N-type semiconductor layer has a thickness in accordance with the following equation:

$$d_{uc} = \{\epsilon \cdot (V_R + \phi_{BI})\}/q \cdot N \cdot d_I$$

wherein $d_{uc}$ is a thickness of at least one of said amorphous P-type and N-type semiconductor layer, $d_I$ is a thickness of said I-type semiconductor layer, N is an impurity concentration in at least one of said amorphous P-type or and N-type semiconductor layer, $\epsilon$ is a dielectric constant in at least one of said amorphous P-type and N-type semiconductor layer, $V_R$ is a reverse bias voltage, $\phi_{BI}$ is a built-in potential of a PIN junction, and q is a unit charge.

* * * * *

UNITED STATES PATENT AND TRADEMARK OFFICE
CERTIFICATE OF CORRECTION

PATENT NO. : 5,414,275
DATED : May 9, 1995
INVENTOR(S) : SHIGETOSHI SUGAWA, ET AL.

Page 1 of 2

It is certified that error appears in the above-identified patent and that said Letters Patent is hereby corrected as shown below:

ON TITLE PAGE

In [56] References Cited, under U.S. PATENT DOCUMENTS:
Insert --4,523,214  6/1985  Hirose et al. ... 357/30K--
and "4,085,711  2/1992  Iwamoto et al. ... 357/30JX"
should be deleted.

COLUMN 1

Line 32, "the" should read --an--.
Line 49, "silicon" should read --silicon,--.

COLUMN 2

Line 4, "P-and" should read --P- and--.
Line 11, "P-and" should read --P- and--.
Line 36, "thee" should read --the--.

COLUMN 4

Line 65, "300° C," should read --300° C--.

COLUMN 9

Line 1, "layer" should read --layers--.
Line 7, "layer," should read --layers,--.
Line 10, "layer," should read --layers,--.
Line 12, "layer," should read --layers,--.
Line 17, "layer" should read --layers--.
Line 22, "layer," should read --layers,--.
Line 25, "layer," should read --layers,--.
Line 27, "layer," should read --layers,--.

UNITED STATES PATENT AND TRADEMARK OFFICE
CERTIFICATE OF CORRECTION

PATENT NO. : 5,414,275

DATED : May 9, 1995

INVENTOR(S) : SHIGETOSHI SUGAWA, ET AL.

It is certified that error appears in the above-identified patent and that said Letters Patent is hereby corrected as shown below:

COLUMN 10

```
Line 1,  "layer" should read --layers--.
Line 7,  "layer," should read --layers,--.
Line 10, "layer," should read --layers,--.
Line 12, "layer," should read --layers,--.
Line 17, "layer" should read --layers--.
Line 23, "layer," should read --layers,--.
Line 26, "or" should be deleted and "layer," should read
         --layers,--.
Line 28, "layer," should read --layers,--.
```

Signed and Sealed this

Nineteenth Day of September, 1995

Attest:

BRUCE LEHMAN

Attesting Officer     Commissioner of Patents and Trademarks